(12) United States Patent
Huang et al.

(10) Patent No.: US 8,546,235 B2
(45) Date of Patent: Oct. 1, 2013

(54) INTEGRATED CIRCUITS INCLUDING METAL-INSULATOR-METAL CAPACITORS AND METHODS OF FORMING THE SAME

(75) Inventors: Sung-Hui Huang, Dongshan Township (TW); Yuan-Hung Liu, Hsinchu (TW); Ming-Fa Chen, Taichung (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 230 days.

(21) Appl. No.: 13/101,788

(22) Filed: May 5, 2011

(65) Prior Publication Data
US 2012/0280358 A1 Nov. 8, 2012

(51) Int. Cl.
*H01L 21/20* (2006.01)
(52) U.S. Cl.
USPC .......................................... 438/394; 438/393
(58) Field of Classification Search
USPC ................................. 438/393, 394
See application file for complete search history.

(56) References Cited

U.S. PATENT DOCUMENTS

| | | | |
|---|---|---|---|
| 5,391,917 A | 2/1995 | Gilmour et al. | |
| 5,510,298 A | 4/1996 | Redwine | |
| 5,767,001 A | 6/1998 | Bertagnolli et al. | |
| 5,998,292 A | 12/1999 | Black et al. | |
| 6,184,060 B1 | 2/2001 | Siniaguine | |
| 6,322,903 B1 | 11/2001 | Siniaguine et al. | |
| 6,448,168 B1 | 9/2002 | Rao et al. | |
| 6,465,892 B2 | 10/2002 | Suga | |
| 6,472,293 B1 | 10/2002 | Suga | |
| 6,538,333 B2 | 3/2003 | Kong | |
| 6,599,778 B2 | 7/2003 | Pogge et al. | |
| 6,639,303 B2 | 10/2003 | Siniaguine | |
| 6,664,129 B2 | 12/2003 | Siniaguine | |
| 6,693,361 B1 | 2/2004 | Siniaguine et al. | |
| 6,740,582 B2 | 5/2004 | Siniaguine | |
| 6,800,930 B2 | 10/2004 | Jackson et al. | |
| 6,841,883 B1 | 1/2005 | Farnworth et al. | |
| 6,882,030 B2 | 4/2005 | Siniaguine | |
| 6,924,551 B2 | 8/2005 | Rumer et al. | |
| 6,962,867 B2 | 11/2005 | Jackson et al. | |
| 6,962,872 B2 | 11/2005 | Chudzik et al. | |
| 7,030,481 B2 | 4/2006 | Chudzik et al. | |
| 7,049,170 B2 | 5/2006 | Savastiouk et al. | |
| 7,060,601 B2 | 6/2006 | Savastiouk et al. | |
| 7,071,546 B2 | 7/2006 | Fey et al. | |
| 7,111,149 B2 | 9/2006 | Eilert | |
| 7,122,912 B2 | 10/2006 | Matsui | |
| 7,157,787 B2 | 1/2007 | Kim et al. | |
| 7,193,308 B2 | 3/2007 | Matsui | |
| 7,262,495 B2 | 8/2007 | Chen et al. | |
| 7,297,574 B2 | 11/2007 | Thomas et al. | |
| 7,335,972 B2 | 2/2008 | Chanchani | |
| 7,355,273 B2 | 4/2008 | Jackson et al. | |
| 2008/0001197 A1* | 1/2008 | Kawakatsu et al. | 257/296 |

* cited by examiner

*Primary Examiner* — Bradley K Smith
(74) *Attorney, Agent, or Firm* — Lowe Hauptman & Ham, LLP

(57) ABSTRACT

An integrated circuit includes a substrate and a first metal-insulator-metal (MIM) capacitor disposed over the substrate. The MIM capacitor includes a first metallic capacitor plate disposed over the substrate. At least one first insulator layer is disposed over the first metallic capacitor plate. A second metallic capacitor plate is disposed over the at least one first insulator layer. At least one first dielectric layer is disposed over the substrate. At least a portion of the at least one first dielectric layer is disposed between the first metallic capacitor plate and the at least one first insulator layer.

20 Claims, 10 Drawing Sheets

INTEGRATED CIRCUITS INCLUDING METAL-INSULATOR-METAL CAPACITORS AND METHODS OF FORMING THE SAME

TECHNICAL FIELD

The present disclosure relates generally to the field of semiconductor devices and, more particularly, to integrated circuits including metal-insulator-metal capacitors and methods of the forming the same.

BACKGROUND OF THE DISCLOSURE

In integrated circuits, capacitors are components for many data manipulation and data storage applications. In general, a capacitor includes two conductive electrodes on opposing sides of a dielectric or other insulating layer, and may be categorized based on the materials employed to form the electrodes. For example, in a metal-insulator-metal (MIM) capacitor, the electrodes substantially comprise metal. MIM capacitors offer the advantage of a relatively constant value of capacitance over a relatively wide range of voltages applied thereto. MIM capacitors also exhibit a relatively small parasitic resistance.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
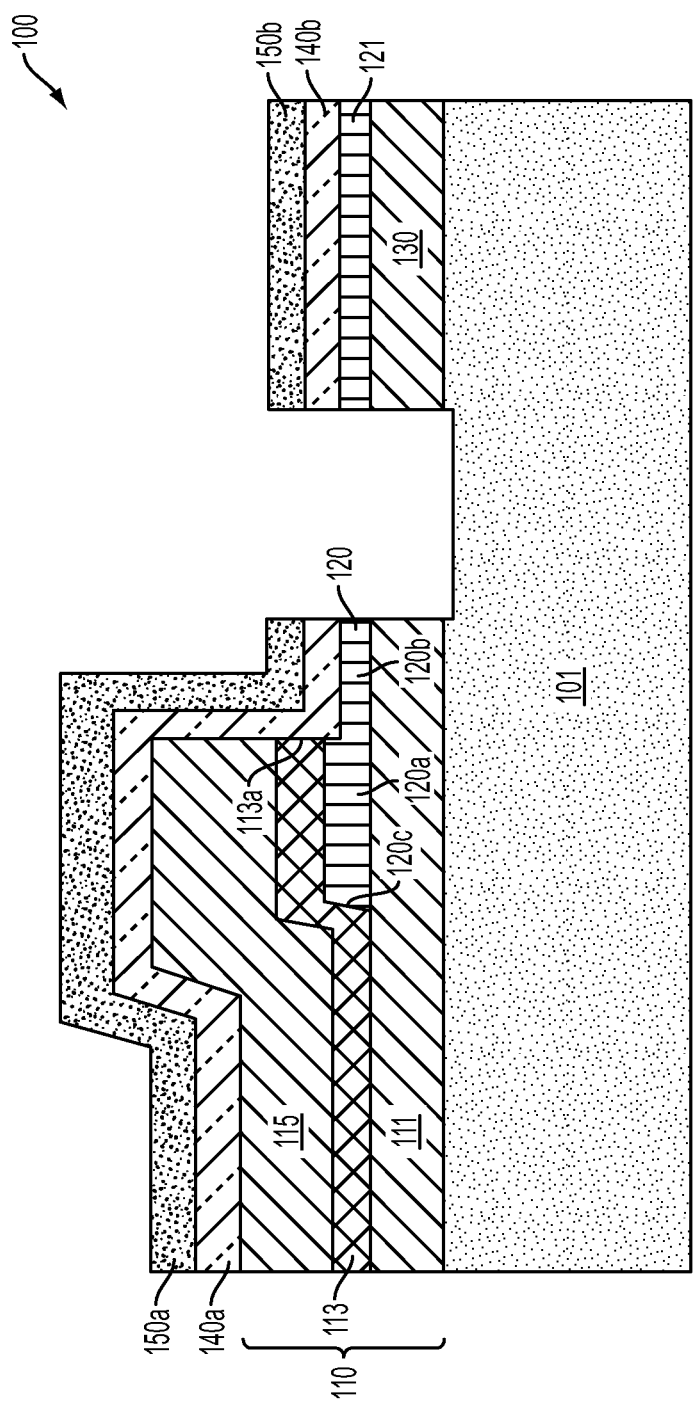
FIG. 1 is a schematic cross-sectional view of an exemplary integrated circuit including a metal-insulator-metal capacitor (MIM) capacitor.

A method of forming a MIM capacitor known to the applicants patterns a top capacitor electrode first. While the top capacitor electrode is patterned, the insulation layer serves as an etch-stop layer besides severing as a dielectric layer of the MIM capacitor. Applicants found that thinning the insulator layer helps to increase the capacitance of the MIM capacitor. Compared with a thicker insulation layer, a thinner insulator layer may not desirably stop the patterning process performed thereon. The failure to stop the patterning process on the insulator layer may induce the failure of the MIM capacitor and/or degrade the breakdown voltage of the MIM capacitor.

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a schematic cross-sectional view of an exemplary integrated circuit including a metal-insulator-metal capacitor (MIM) capacitor. In some embodiments, an integrated circuit includes a substrate and a first metal-insulator-metal (MIM) capacitor disposed over the substrate. The MIM capacitor includes a first metallic capacitor plate disposed over the substrate. At least one first insulator layer is disposed over the first metallic capacitor plate. A second metallic capacitor plate is disposed over the at least one first insulator layer. At least one first dielectric layer is disposed over the substrate. At least a portion of the at least one first dielectric layer is disposed between the first metallic capacitor plate and the at least one first insulator layer.

For example, an integrated circuit 100 includes a substrate 101 and a MIM capacitor 110 that is disposed over the substrate 101 as shown in FIG. 1. In some embodiments, the substrate 101 may include an elementary semiconductor including silicon or germanium in crystal, polycrystalline, or an amorphous structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; or combinations thereof. In at least one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator, such as a silicon on insulator (SOI), or a thin film transistor (TFT). In some examples, the semiconductor substrate may include a doped epi layer or a buried layer. In other examples, the compound semiconductor substrate may have a multilayer structure, or the substrate may include a multilayer compound semiconductor structure.

In some embodiments, various passive and/or active devices (not shown) can be formed on and/or over the substrate 101. For example, the passive and/or active devices can include resistors, inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, FinFET transistors, other types of transistors, and/or any combinations thereof.

Referring again to FIG. 1, the MIM capacitor 110 includes metallic capacitor plates 111 and 115 that are disposed over the substrate 101. At least one first insulator layer, e.g., an insulator layer 113 is disposed between the metallic capacitor plates 111 and 115. In some embodiments, the metallic capacitor plates 111 and 115 can each be made of at least one material, such as aluminum, copper, aluminum copper, tantalum, tantalum nitride, titanium, titanium nitride, tantalum silicon nitride, tungsten, tungsten nitride, other metallic materials, and/or any combinations thereof.

In some embodiments, the insulator layer 113 can have a dielectric constant higher than that of a silicon dioxide, e.g., about 3.9. To increase the capacitance of the MIM capacitor 110, the thickness of the insulator 113 can be reduced and/or a high dielectric constant (high-k) material can be adapted as the insulator layer 113. In some embodiments, the insulator layer 113 can have a thickness ranging from about 50 Å to about 300 Å. For example, the insulator layer 113 can be made of plasma enhanced silicon nitride (PESIN) having a thickness of about 100 Å. In other embodiments using a high-k dielectric material, the thickness of the insulator layer 113 can be less than 100 Å. In still other embodiments, the insulator layer 113 can be made of at least one material, such as silicon oxynitride, silicon nitride, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other dielectric materials, and/or any combinations thereof. Though merely showing a single layer of the insulator 113, the scope of this application is not limited thereto. In some embodiments, the insulator layer 113 can be a mulit-layer structure.

Referring again to FIG. 1, the integrated circuit 100 includes at least one dielectric layer, e.g., a dielectric layer 120. In some embodiments, the dielectric layer 120 can have an etching selectivity that is different from the insulator layer 113. For example, an etching process may remove the insulator layer 113 faster than the dielectric layer 120. In some embodiments, the dielectric layer 120 can be made of at least one material, such as silicon oxide, silicon nitride, silicon oxynitride, silicon carbide, silicon oxycarbide, silicon carbon nitride, other dielectric materials, and/or any combinations thereof.

In some embodiments, the dielectric layer 120 includes portions 120a and 120b. The portion 120a is disposed between the metallic capacitor plate 111 and the insulator layer 113. The portion 120b is not covered by the insulator layer 113. In some embodiments, an edge 120c of the dielectric layer 120 is under the insulator layer 113. The edge 120c is separated from an edge 113a of the insulator layer 113, in a direction substantially parallel with the top surface of the substrate 101, by a distance of about 1,000 Å or less.

In some embodiments, the dielectric layer 120 can have a thickness ranging from about 100 Å to about 500 Å. In other embodiments, the portion 120a is thicker than the portion 120b. In still other embodiments, the thickness difference between the portions 120a and 120b can range from about tens of angstroms to about hundreds of angstroms. It is noted that though merely showing a single layer of the dielectric layer 120, the scope of this application is not limited thereto. In some embodiments the dielectric layer 120 can be a multi-layer structure.

Referring to FIG. 1, in some embodiments the integrated circuit 100 further includes a metallic resistor 130 that is disposed over the substrate 101. In some embodiments, the metallic resistor 130 can be made of at least one metallic material that is the same as the metallic capacitor plate 111. In other embodiments, the metallic resistor 130 and the metallic capacitor plate 111 can have the same thickness.

In some embodiments, at least one dielectric layer can be disposed over the MIM capacitor. For example, dielectric layers 140a, 150a and 140b, 150b are disposed over the metallic capacitor plate 115 and the metallic resistor 130, respectively, as shown in FIG. 1. The dielectric layers 140a-140b and 150a-150b can each be made of at least one material, such as silicon oxide, silicon nitride, silicon oxynitride, silicon carbide, silicon oxycarbide, other dielectric materials, and/or any combinations thereof. In some embodiments, the dielectric layers 140a-140b can be referred to as cap dielectric layers. The dielectric layers 150a-150b can be referred to as via etch-stop layers.

Figure 2:
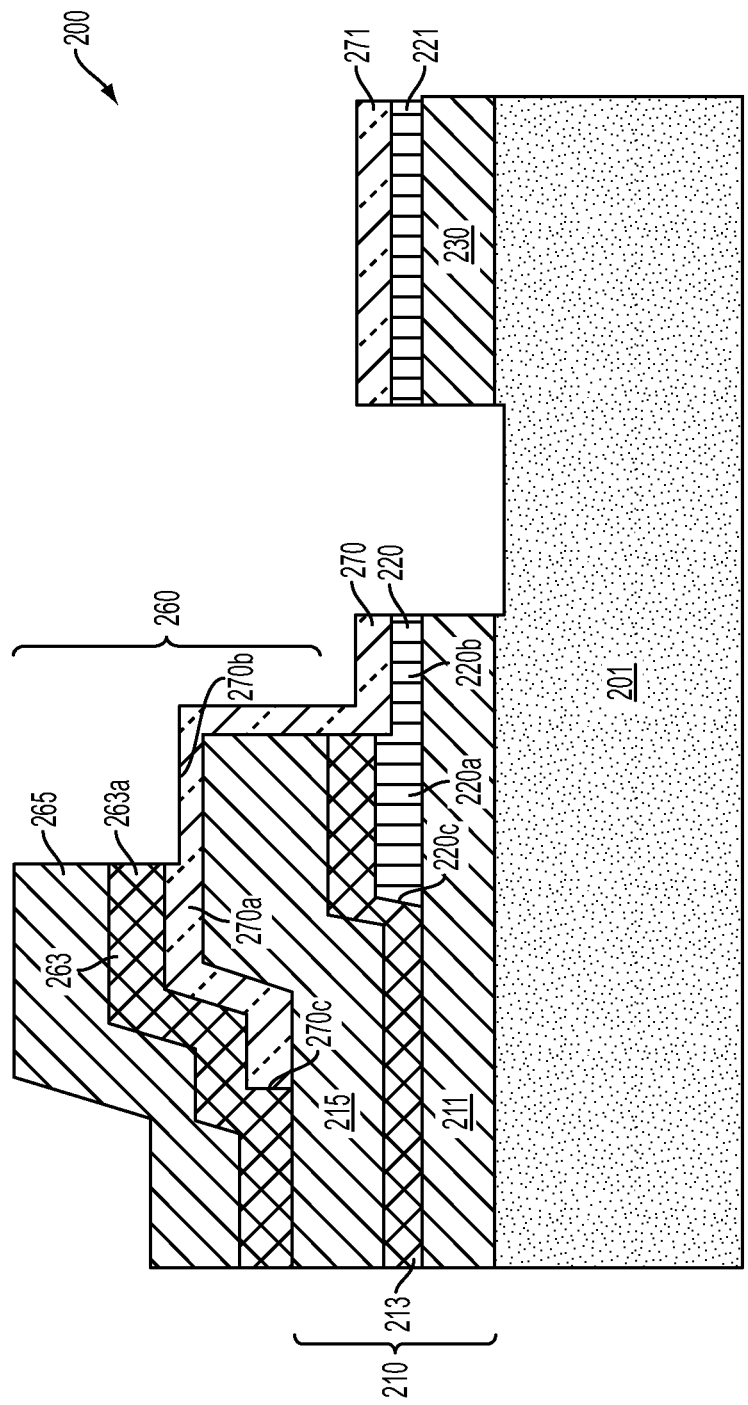
FIG. 2 is a schematic cross-sectional view of an exemplary integrated circuit including two MIM capacitors.

In some embodiments, an integrated circuit can include two or more MIM capacitors that are disposed over a substrate. FIG. 2 is a cross-sectional view of another exemplary integrated circuit including two MIM capacitors. Items of an integrated circuit 200 in FIG. 2 that are the same or similar items of the integrated circuit 100 in FIG. 1 are indicated by the same reference numerals, increased by 100.

In FIG. 2, an integrated circuit 200 includes MIM capacitors 210 and 260. The MIM capacitor 210 includes the metallic capacitor plates 211 and 215. The MIM capacitor 260 includes metallic capacitor plates 215 and 265. At least one insulator layer, e.g., an insulator layer 263 is disposed between the metallic capacitor plates 215 and 265. In some embodiments, the metallic capacitor plate 265 can be made of at least one material that is the same as or similar to that of the metallic capacitor plate 215. In other embodiments, the insulator layer 263 can made of at least one material that is the same as or similar to that of the insulator layer 213.

Referring to FIG. 2, the integrated circuit 200 includes at least one dielectric layer, e.g., a dielectric layer 270. In some embodiments, the dielectric layer 270 can have an etching selectivity that is different from the insulator layer 263. For example, an etching process may remove the insulator layer 263 faster than the dielectric layer 270. In some embodiments, the dielectric layer 270 can be made of at least one material, such as silicon oxide, silicon nitride, silicon oxynitride, silicon carbide, silicon oxycarbide, silicon carbon nitride, other dielectric materials, and/or any combinations thereof.

In some embodiments, the dielectric layer 270 includes portions 270a and 270b. The portion 270a is disposed between the metallic capacitor plate 215 and the insulator layer 263. The portion 270b is not covered by the insulator layer 263. In some embodiments, an edge 270c of the dielectric layer 270 is under the insulator layer 263. The edge 270c is separated from an edge 263a of the insulator layer 263, in a direction substantially parallel with the top surface of the substrate 201, by a distance of about 1,000 Å or less.

In some embodiments, the dielectric layer 270 can have a thickness ranging from about 100 Å to about 500 Å. In other embodiments, the portion 270a is thicker than the portion 270b. In still other embodiments, the thickness difference between the portions 270a and 270b can range from about tens of angstroms to about hundreds of angstroms. It is noted that though merely showing a single layer of the dielectric layer 270, the scope of this application is not limited thereto. In some embodiments the dielectric layer 270 can be a multi-layer structure.

Figure 3:
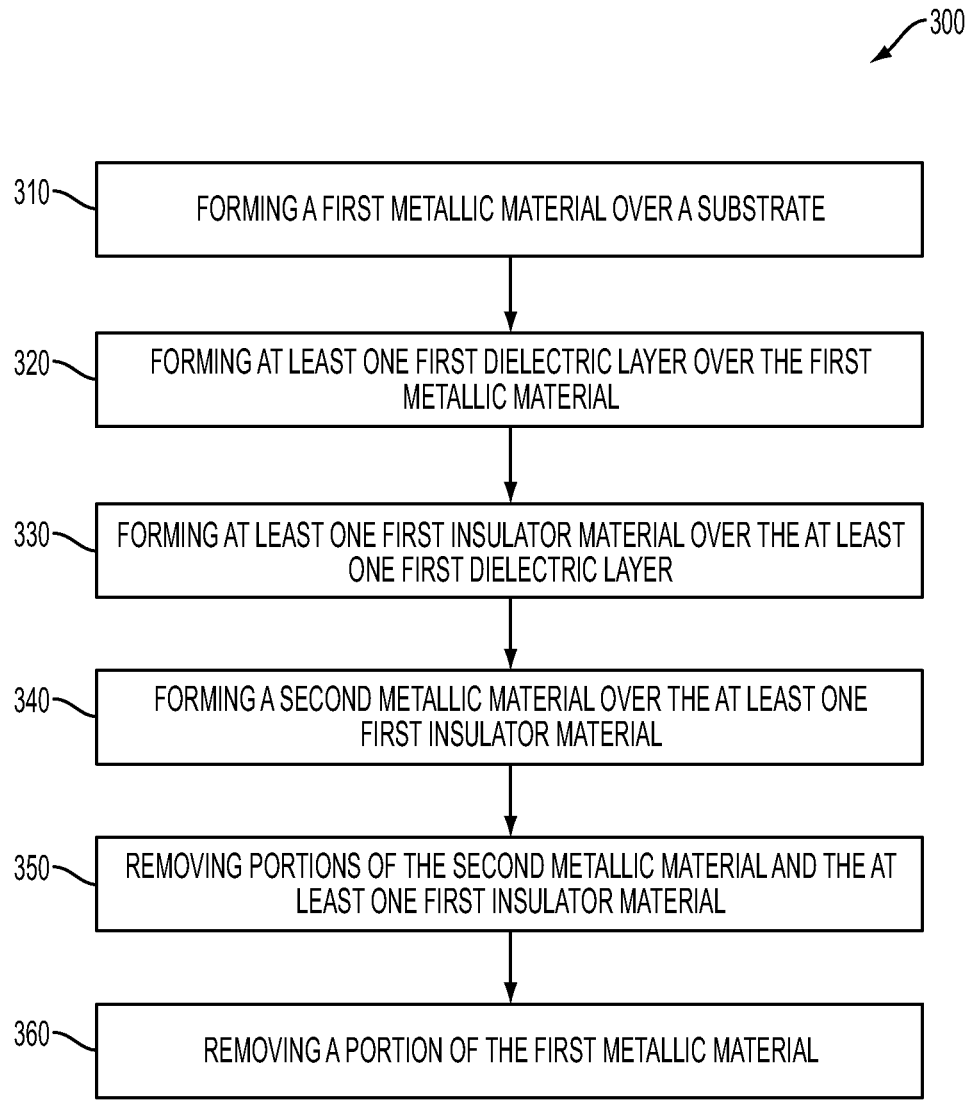
FIG. 3 is a flowchart of an exemplary method of forming an integrated circuit including a MIM capacitor.

FIG. 3 is a flowchart of an exemplary method of forming an integrated circuit including a MIM capacitor. FIGS. 4A-4E are schematic cross-sectional views of an integrated circuit during various fabrication stages. Items of an integrated circuit 400 in FIGS. 4A-4E that are the same or similar items of the integrated circuit 100 in FIG. 1 are indicated by the same reference numerals, increased by 300. It is understood that FIGS. 3 and 4A-4E have been simplified for a better understanding of the concepts of the present disclosure. Accordingly, it should be noted that additional processes may be provided before, during, and after the methods of FIGS. 3 and 4A-4E, and that some other processes may only be briefly described herein.

Referring now to FIG. 3, a method 300 of forming an integrated circuit includes forming a first metallic material over a substrate (block 310). At least one first dielectric layer is formed over the first metallic material (block 320). At least one first insulator material is formed over the at least one first dielectric layer (block 330). A second metallic material is formed over the at least one first insulator material (block 340). Portions of the second metallic material and the at least one first insulator material are removed (block 350). A portion of the first metallic material is removed (block 360).

Referring now to FIGS. 4A-4E in conjunction with FIG. 3, an integrated circuit 400 can be fabricated in accordance with the method 300 of FIG. 3. As shown in FIG. 3, the method 300 includes forming a first metallic material over a substrate (block 310). For example, a metallic material 403 is formed over a substrate 401. The metallic material 403 can include at least one material, such as aluminum, copper, aluminum copper, tantalum, tantalum nitride, titanium, titanium nitride, tantalum silicon nitride, tungsten, tungsten nitride, other metallic materials, and/or any combinations thereof. In some embodiments, the metallic material 403 can be formed by, for example, chemical vapor deposition (CVD), physical vapor deposition (PVD), remote plasma CVD (RPCVD), plasma enhanced CVD (PECVD), metal organic CVD (MOCVD), sputtering, plating, other suitable processes, and/or combinations thereof.

Figure 4A:
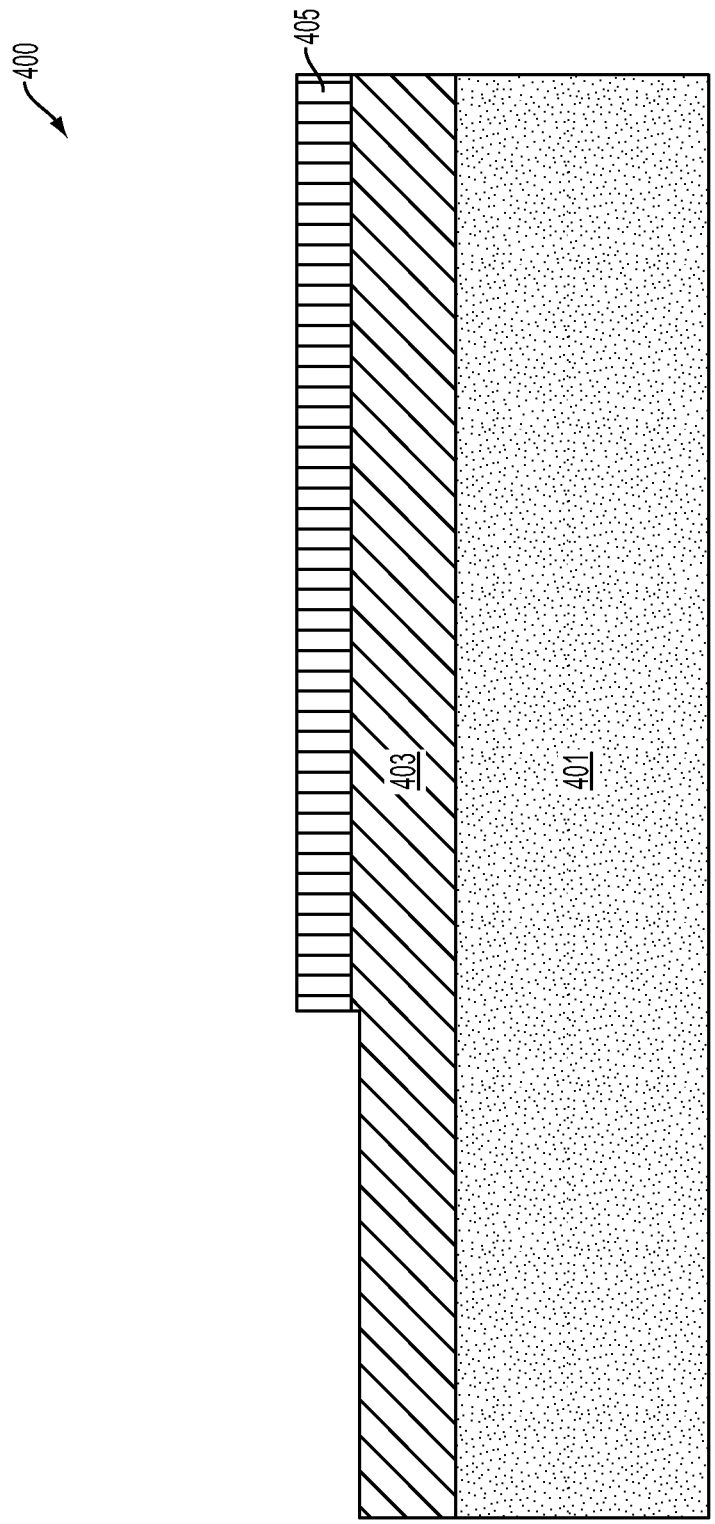
FIGS. 4A-4E are schematic cross-sectional views of an integrated circuit having a MIM capacitor during various fabrication stages.

Referring to FIG. 3, the method 300 includes forming at least one first dielectric layer over the first metallic material (block 320). For example, at least one dielectric layer, e.g., a dielectric layer 405 is formed over the metallic material 403 as shown in FIG. 4A. In some embodiments, the dielectric layer 405 can be a patterned dielectric material. For example, a dielectric material is formed over the metallic material 403. A photolithographic method and an etching process are followed to pattern the dielectric material so as to form the dielectric layer 405. The dielectric layer 405 can include at least one material, such as silicon oxide, silicon nitride, silicon oxynitride, silicon carbide, silicon oxycarbide, silicon carbon nitride, other dielectric materials, and/or any combinations thereof.

Referring to FIG. 3, the method 300 includes forming at least one first insulator material over the at least one first dielectric layer (block 330). For example, at least one insulator material, e.g., an insulator material 407 is formed over the dielectric layer 405 as show in FIG. 4B. In some embodiments, the insulator material 407 can be substantially conformal over the dielectric layer 405 and the metallic material 403.

In some embodiments, the insulator material 407 can include at least one material, such as silicon oxynitride, silicon nitride, hafnium oxide (HfO$_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other dielectric materials, and/or any combinations thereof. The insulator material 407 can be formed by any suitable process, such as atomic layer deposition (ALD), chemical vapor deposition (CVD), physical vapor deposition (PVD), remote plasma CVD (RPCVD), plasma enhanced CVD (PECVD), metal organic CVD (MOCVD), other suitable processes, and/or any combinations thereof.

Figure 4B:
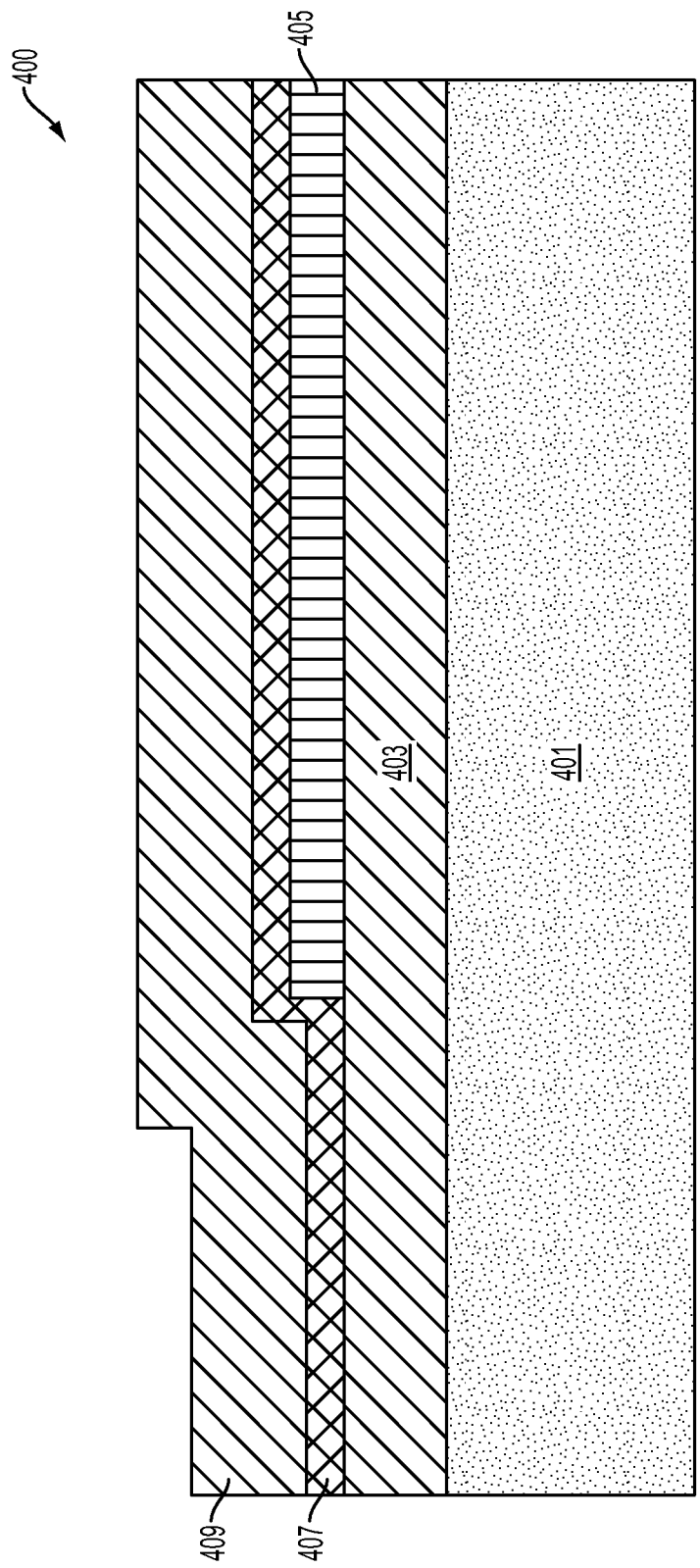

Referring to FIG. 3, the method 300 includes forming a second metallic material over the at least one first insulator material (block 340). For example, a metallic material 409 is formed over the insulator material 407 as shown in FIG. 4B. In some embodiments, the metallic material 409 can include at least one material, such as aluminum, copper, aluminum copper, tantalum, tantalum nitride, titanium, titanium nitride, tantalum silicon nitride, tungsten, tungsten nitride, other metallic materials, and/or any combinations thereof. In some embodiments, the metallic material 409 can be formed by, for example, chemical vapor deposition (CVD), physical vapor deposition (PVD), remote plasma CVD (RPCVD), plasma enhanced CVD (PECVD), metal organic CVD (MOCVD), sputtering, plating, other suitable processes, and/or combinations thereof.

Referring again to FIG. 3, the method 300 includes removing portions of the second metallic material and the at least one first insulator material (block 350). For example, portions of the metallic material 409 and the insulator material 407 are removed by using a mask layer (not shown) that covers other portions of the metallic material 409 and the insulator material 407. The remaining portions of the metallic material 409 and the insulator material 407 can be referred to as a metallic capacitor plate 415 and an insulator layer 413 of a MIM capacitor as shown in FIG. 4C.

Figure 4C:
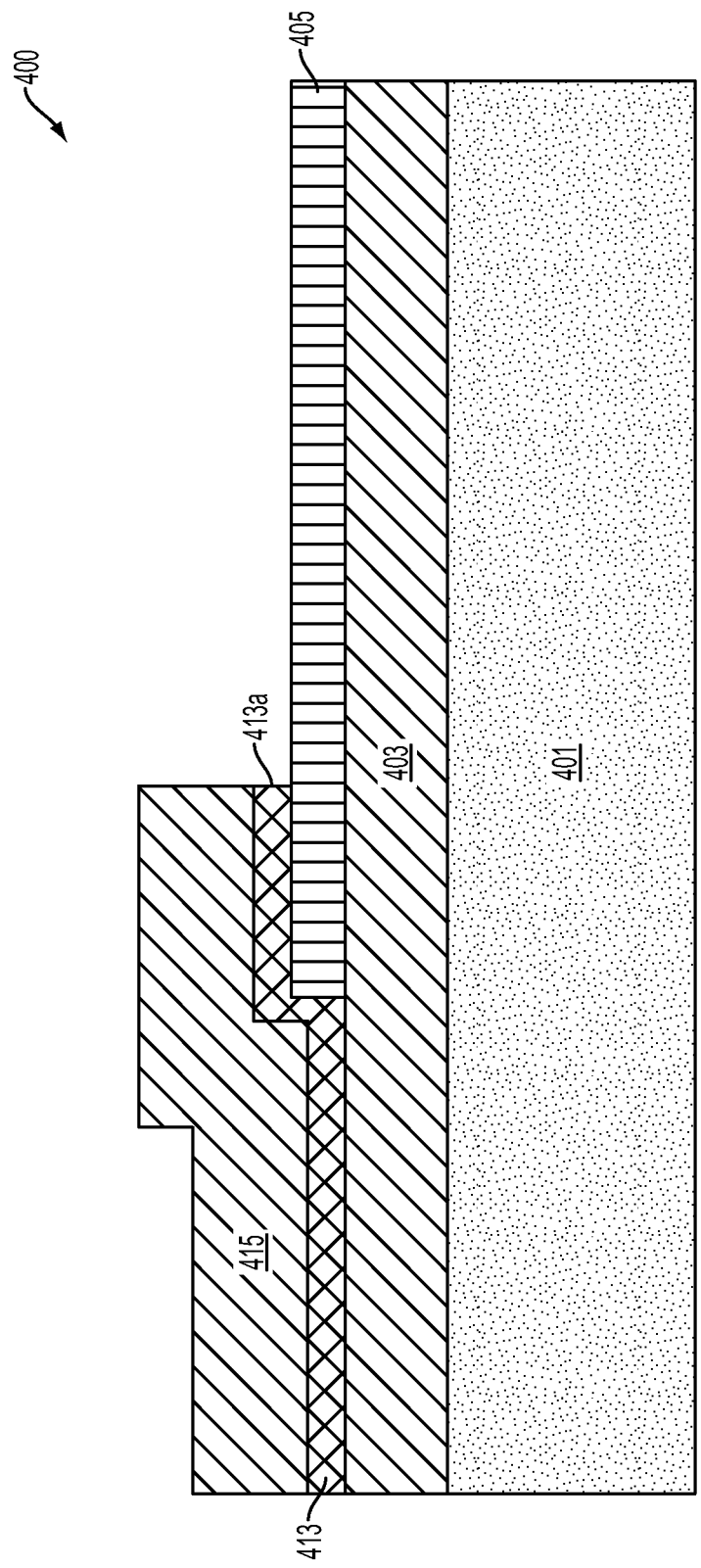

Referring to FIG. 4C, the dielectric layer 405 serves as an etch-stop layer during the removal process. In some embodiments, the removal process can have an etching rate to the insulator layer 407 that is faster than the etching rate to the dielectric layer 405. In some embodiments, the removal process removes a top portion of the dielectric layer 405 that is not covered by the mask layer. In this embodiment, the portion of the dielectric layer 405 that is covered by the insulator 413 is thicker than the portion of the dielectric layer 405 that is not covered by the insulator 413.

Figure 4D:
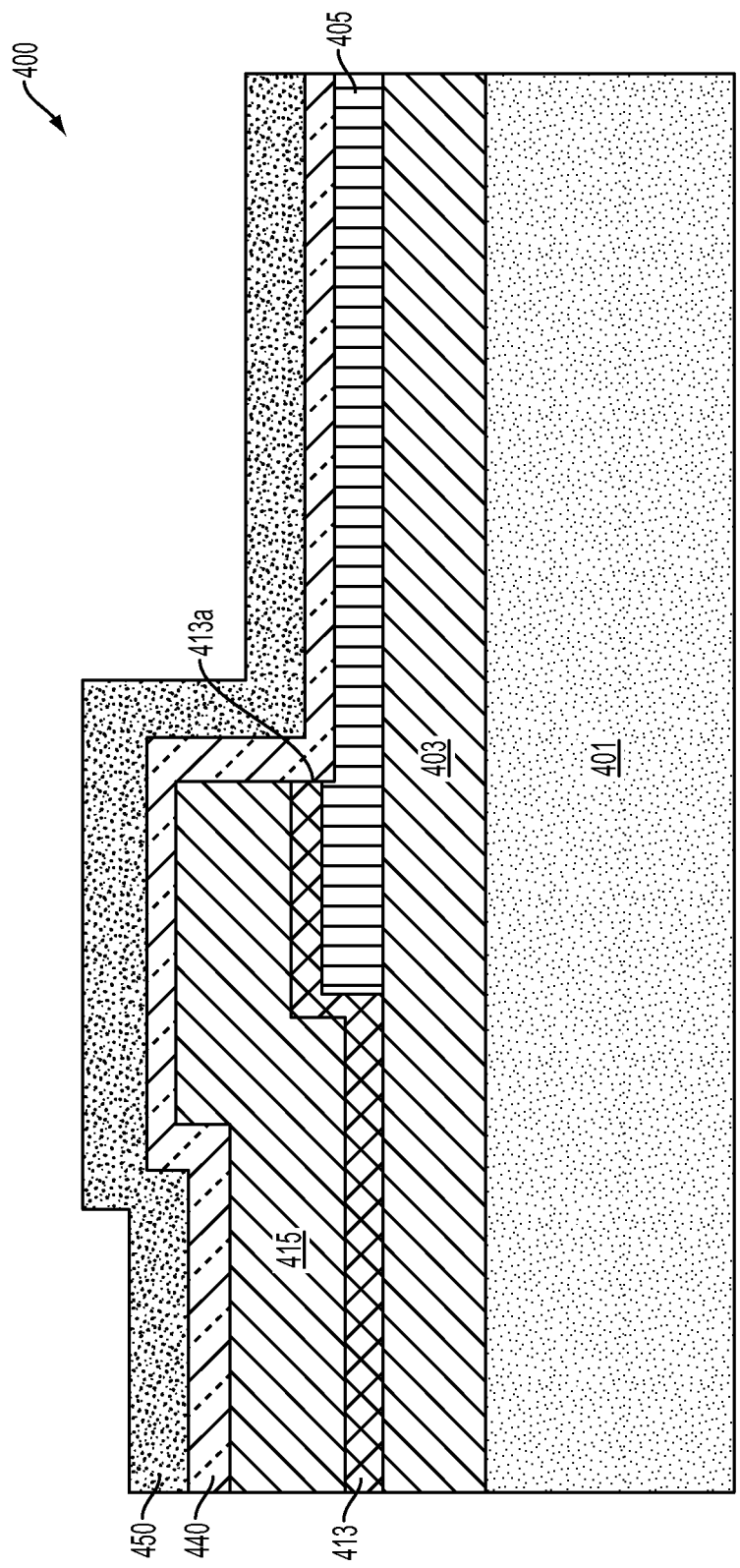

In some embodiments, dielectric materials 440 and 450 are formed over the metallic capacitor plate 415 and the dielectric layer 405 as shown in FIG. 4D. In some embodiments, the dielectric materials 440 and 450 can each include at least one material, such as silicon oxide, silicon nitride, silicon oxynitride, silicon carbide, silicon oxycarbide, silicon carbon nitride, other dielectric materials, and/or any combinations thereof. In some embodiments, the dielectric materials 440 and 450 can be formed by CVD.

Figure 4E:
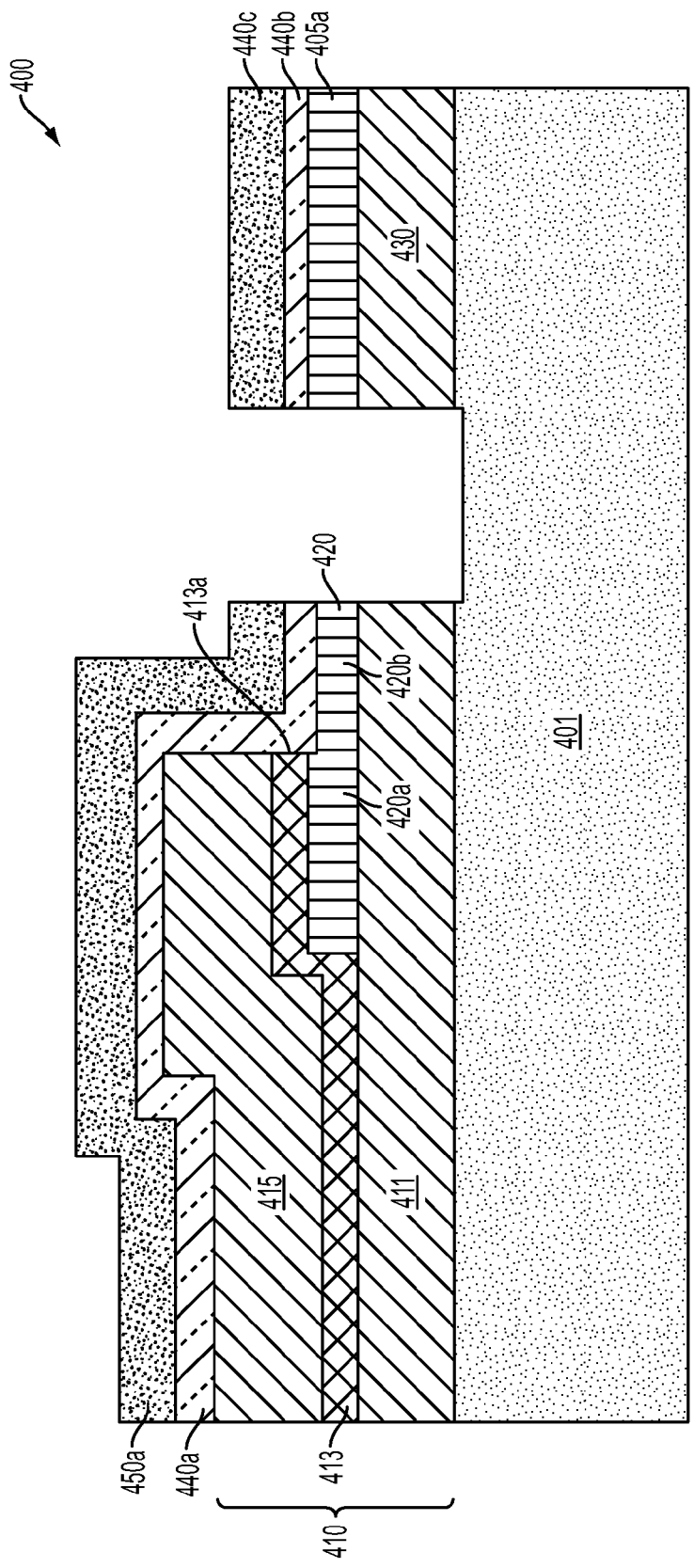

Referring again to FIG. 3, the method 300 includes removing a portion of the first metallic material (block 360). For example, portions of the dielectric materials 130-140 and metallic material 403 are removed by using a mask layer (not shown) that covers other portions of the metallic material 403. The remaining portions of the dielectric materials 440 and 450 can be referred to as dielectric layers 440a-440b and 450a-450b as shown in FIG. 4E. In some embodiments, the dielectric layer 440a-440b can be referred to as cap dielectric layers. The dielectric layer 450a-450b can be referred to as via etch-stop layers. The remaining portions of the metallic material 403 can be referred to as a metallic capacitor plate 411 of the MIM capacitor 410 and a metallic resistor 430 as shown in FIG. 4E. Being derived from the metallic material 403, the metallic resistor 430 and the metallic capacitor plate 411 have the same material and the same thickness.

As noted, the dielectric layer 405 serving as an etch-stop layer can withstand the removal process performed thereon, such that the removal process does not damage the metallic material 403 as shown in FIG. 4C. By using the dielectric layer 405, the failure or breakdown voltage degradation of the MIM capacitor 410 formed by the method 300 can be reduced.

In some embodiments, after patterning the metallic capacitor plate 411, an interconnect structure can be formed thereover. For example, at least one dielectric layer (not shown) can be disposed over the dielectric layers 450a and 450b. The dielectric layer may include materials such as low-k dielectric material, ultra low-k dielectric material, extreme low-k material, or any combinations thereof. The dielectric layer may be formed by, for example, a CVD process or a spin-coating process.

In some embodiments, dual damascene structures (not shown) can be formed within the at least one dielectric layer. For example, dual damascene openings (not shown) can be formed by means which involves coating and patterning a photoresist layer (not shown) on the dielectric layer and forming an opening through the dielectric layer by plasma etching. The remaining photoresist layer can be stripped by an ashing and/or with an application of a liquid stripper. In some embodiments, a diffusion barrier layer (not shown) including materials such as Ta, TaN, Ti, TiN, TaSiN, W, WN, other barrier layer material, and/or combinations thereof can be formed on the sidewalls of the openings by, for example, a CVD process, a PECVD process, or an atomic layer deposition (ALD). The diffusion barrier layer can be formed on the sidewalls and/or bottom of the opening. A following metallic layer including materials such as copper, tungsten, Al, Al/Cu, other conductive material, and/or combinations thereof can be deposited by a CVD, PVD, ALD, electroplating method, and/or other process to fill the openings to form the dual damascene structure. The damascene structure can be achieved by a chemical mechanical polish (CMP) process that can polish the metallic layer, forming the metallic lines.

Figure 5A:
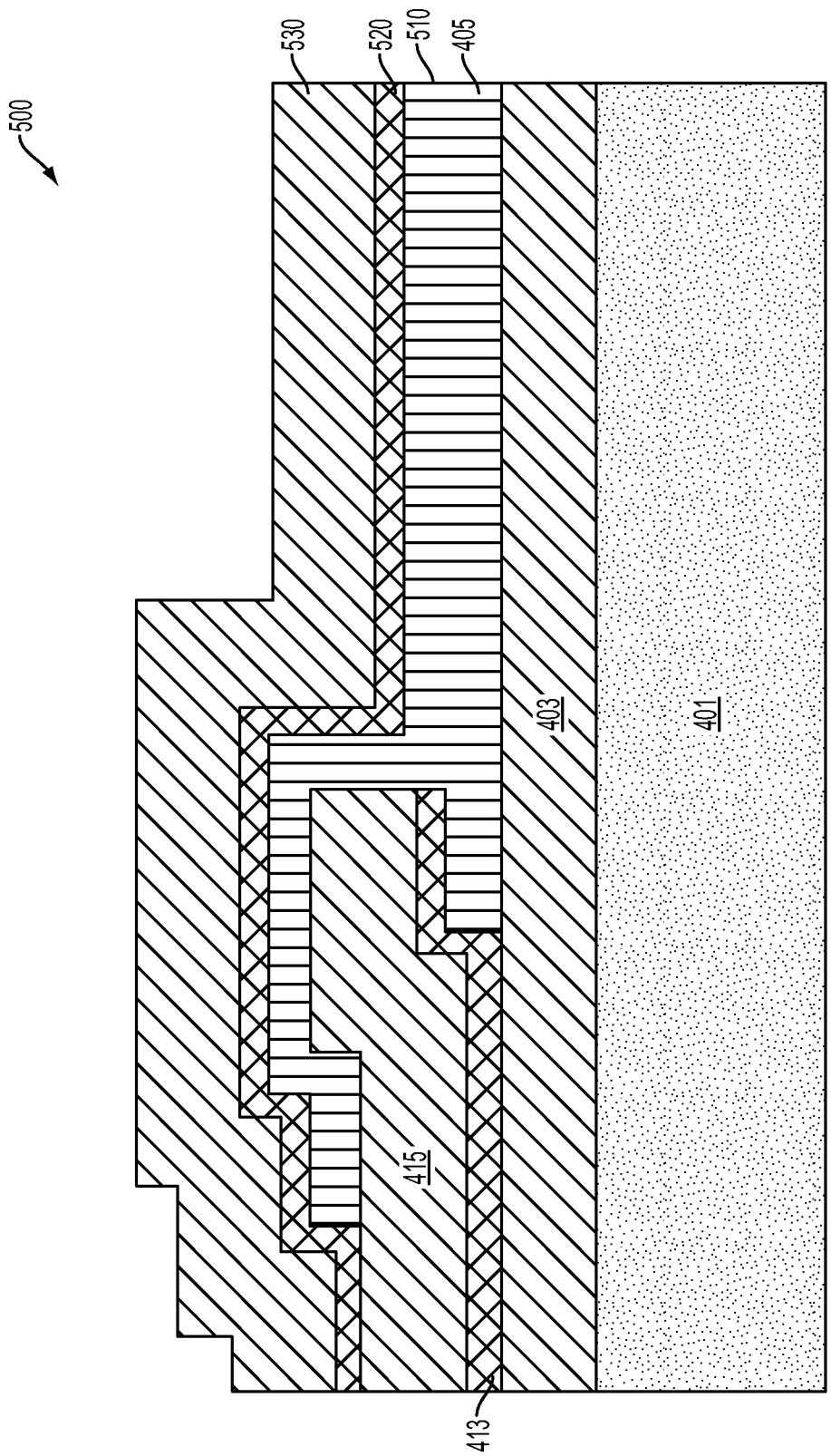
FIGS. 5A-5B are schematic cross-sectional views of an integrated circuit having two MIM capacitors during various fabrication stages.

In some embodiments, more than one MIM capacitor that is the same as or similar to the structure shown in FIG. 2 is formed by repeating the operations depicted in blocks 320-350 before or after performing the operation depicted in block 360. For example, the method 300 can include forming at least one dielectric layer, e.g., a dielectric layer 510 over the metallic capacitor plate 415 as shown in FIG. 5A. The dielectric layer 510 can be formed by the process that is the same as or similar to the process of the dielectric layer 405 as described above in conjunction with FIG. 4A.

Referring to FIG. 5A, at least one insulator material, e.g., an insulator material 520 can be formed over the dielectric layer 510. In some embodiments, the insulator material 520 can be formed by the process that is as same as or similar to the process of the insulator material 407 as described above in conjunction with FIG. 4B.

Referring again to FIG. 5A, a metallic material 530 can be formed over the insulator material 520. In some embodiments, the metallic material 530 can be formed by the process that is as same as or similar to the process of the metallic material 409 as described above in conjunction with FIG. 4B.

Figure 5B:
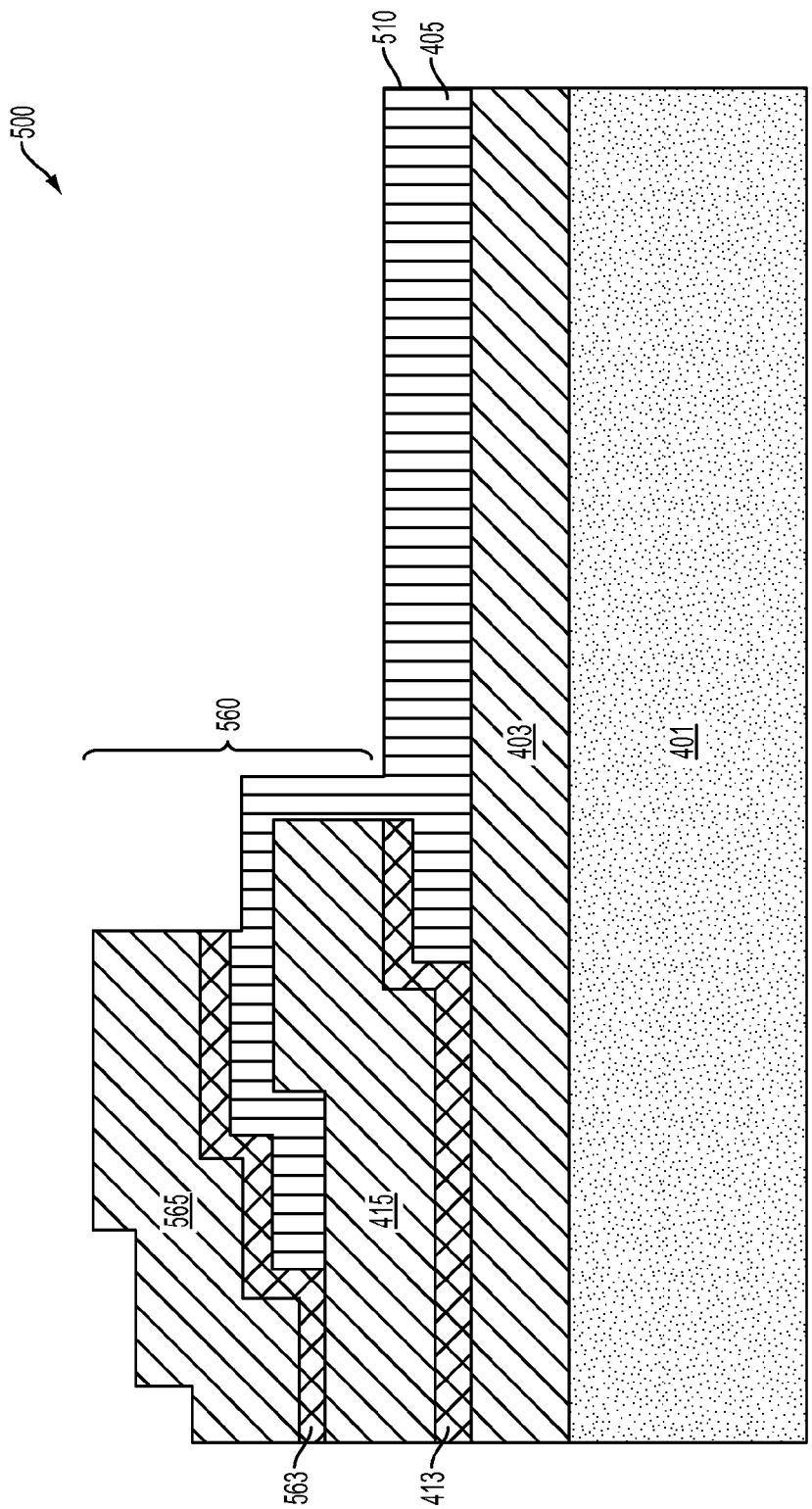

Referring to FIG. 5B, portions of the metallic material 530 and the insulator material 520 are removed by using a mask layer (not shown) that covers other portions of the metallic material 530 and the insulator material 520. The remaining portions of the metallic material 530 and the insulator material 520 can be referred to as a metallic capacitor plate 565 and an insulator layer 563 of a MIM capacitor 560, respectively.

Referring to FIG. 5B, the dielectric layer 510 serves as an etch-stop layer for removing the portions of the metallic material 530 and the insulator material 520. In some embodiments, the removal process can have an etching rate of the insulator layer 563 that is faster than the etching rate of the dielectric layer 510. In some embodiments, the removal process also removes a top portion of the dielectric layer 510 that is not covered by the mask layer. In this embodiment, the portion of the dielectric layer 510 that is covered by the insulator 563 is thicker than the portion of the dielectric layer 510 that is not covered by the insulator 563. After patterning the metallic capacitor plate 565 and the insulator layer 563, the processes described above in conjunction with FIGS. 4C-4E can be followed to form the metallic capacitor plate 411, the insulator layer 413 and the metallic resistor 430, such that an integrated circuit having two MIM capacitors similar to the integrated circuit 200 can be achieved.

As noted, the dielectric layer 510 serving as an etch-stop layer can withstand the removal process performed thereon, such that the removal process does not damage the metallic capacitor plate 415 as shown in FIG. 5B. By using the dielectric layer 510, the failure or breakdown voltage degradation of the MIM capacitor 560 can be reduced.

In a first embodiment of this application, an integrated circuit includes a substrate and a first metal-insulator-metal (MIM) capacitor disposed over the substrate. The MIM capacitor includes a first metallic capacitor plate disposed over the substrate. At least one first insulator layer is disposed over the first metallic capacitor plate. A second metallic capacitor plate is disposed over the at least one first insulator layer. At least one first dielectric layer is disposed over the substrate. At least a portion of the at least one first dielectric layer is disposed between the first metallic capacitor plate and the at least one first insulator layer.

In a second embodiment of this application, a method of forming an integrated circuit includes forming a first metallic material over a substrate. At least one first dielectric layer is formed over the first metallic material. At least one first insulator material is formed over the at least one first dielectric layer. A second metallic material is formed over the at least one first insulator material. Portions of the second metallic material and the at least one first insulator material are removed so as to form a first metallic capacitor plate and at least one first insulator layer of a first MIM capacitor. The removal process uses the at least one first dielectric layer as an etch stop layer. A portion of the first metallic material is removed so as to form a second metallic capacitor plate of the first MIM capacitor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
   a substrate;
   a first metal-insulator-metal (MIM) capacitor disposed over the substrate, the MIM capacitor comprising:
      a first metallic capacitor plate disposed over the substrate;
      at least one first insulator layer disposed over the first metallic capacitor plate; and
      a second metallic capacitor plate disposed over the at least one first insulator layer; and
   at least one first dielectric layer, wherein at least a portion of the at least one first dielectric layer is disposed between the first metallic capacitor plate and the at least one first insulator layer;

wherein the at least one first dielectric layer includes a first portion and a second portion, the first portion is between the first metallic capacitor plate and the at least one first insulator layer, the second portion is not covered by the at least one first insulator layer, and the first portion is thicker than the second portion.

2. The integrated circuit of claim 1, wherein an edge of the at least one first dielectric layer under the at least one first insulator layer is separated from an edge of the at least one first insulator layer by a distance of about 1,000 Å or less.

3. The integrated circuit of claim 1, wherein an etching selectivity of the at least one first dielectric layer is different from that of the at least one first insulator layer.

4. The integrated circuit of claim 1, wherein the at least one first insulator includes at least one material having a dielectric constant that is larger than 3.9.

5. The integrated circuit of claim 1, further comprising:
a metallic resistor disposed over the substrate, wherein the metallic resistor having a thickness same as the first metallic capacitor plate.

6. An integrated circuit comprising:
a substrate;
a first metal-insulator-metal (MIM) capacitor disposed over the substrate, the MIM capacitor comprising:
a first metallic capacitor plate disposed over the substrate;
at least one first insulator layer disposed over the first metallic capacitor plate; and
a second metallic capacitor plate disposed over the at least one first insulator layer;
at least one first dielectric layer, wherein at least a portion of the at least one first dielectric layer is disposed between the first metallic capacitor plate and the at least one first insulator layer; and
a metallic resistor disposed over the substrate, wherein the metallic resistor having a metallic material as same as the first metallic capacitor plate.

7. The integrated circuit of claim 6, further comprising:
a second MIM capacitor, wherein the second MIM capacitor comprises:
the second metallic capacitor plate;
at least one second insulator layer disposed over the second metallic capacitor plate; and
a third metallic capacitor plate disposed over the at least one second insulator layer; and
at least one second dielectric layer, wherein at least a portion of the at least one second dielectric layer is disposed between the second metallic capacitor plate and the at least one second insulator layer.

8. The integrated circuit of claim 7, wherein an edge of the at least one second dielectric layer under the at least one second insulator layer is separated from an edge of the at least one second insulator layer by a distance of about 1,000 Å or less.

9. The integrated circuit of claim 7, wherein an etching selectivity of the at least one second dielectric layer is different from that of the at least one second insulator layer.

10. The integrated circuit of claim 7, wherein the at least one second dielectric layer includes a first portion and a second portion, the first portion is between the second metallic capacitor plate and the at least one second insulator layer, the second portion is not covered by the at least one second insulator layer, and the first portion is thicker than the second portion.

11. An integrated circuit comprising:
a substrate;
a first metal-insulator-metal (MIM) capacitor disposed over the substrate, the MIM capacitor comprising:
a first metallic capacitor plate disposed over the substrate;
at least one first insulator layer disposed over the first metallic capacitor plate; and
a second metallic capacitor plate disposed over the at least one first insulator layer;
at least one first dielectric layer, wherein the at least one first dielectric layer includes a first portion and a second portion, the first portion is between the first metallic capacitor plate and the at least one first insulator layer, the second portion is not covered by the at least one first insulator layer, and the first portion is thicker than the second portion; and
a metallic resistor disposed over the substrate, wherein the metallic resistor having a metallic material as same as the first metallic capacitor plate.

12. The integrated circuit of claim 11, wherein an edge of the at least one first dielectric layer under the at least one first insulator layer is separated from an edge of the at least one first insulator layer by a distance of about 1,000 Å A or less.

13. The integrated circuit of claim 11, further comprising:
a second MIM capacitor, wherein the second MIM capacitor comprises:
the second metallic capacitor plate;
at least one second insulator layer disposed over the second metallic capacitor plate; and
a third metallic capacitor plate disposed over the at least one second insulator layer; and
at least one second dielectric layer, wherein at least a portion of the at least one second dielectric layer is disposed between the second metallic capacitor plate and the at least one second insulator layer.

14. The integrated circuit of claim 13, wherein the at least one second dielectric layer includes a first portion and a second portion, the first portion is between the second metallic capacitor plate and the at least one second insulator layer, the second portion is not covered by the at least one second insulator layer, and the first portion is thicker than the second portion.

15. A method of forming an integrated circuit, the method comprising:
forming a first metallic material over a substrate;
forming at least one first dielectric layer over the first metallic material;
forming at least one first insulator material over the at least one first dielectric layer;
forming a second metallic material over the at least one first insulator material;
removing portions of the second metallic material and the at least one first insulator material so as to form a first metallic capacitor plate and at least one first insulator layer of a first MIM capacitor, wherein the removal process uses the at least one first dielectric layer as an etch stop layer; and
removing a portion of the first metallic material so as to form a second metallic capacitor plate of the first MIM capacitor.

16. The method of claim 15, wherein removing portions of the second metallic material and the at least one first insulator material has an etching rate to the at least one first insulator layer that is larger than that to the at least one first dielectric layer.

17. The method of claim 15, wherein the at least one first insulator layer covers at least a portion of the at least one first dielectric layer.

18. The method of claim 15, wherein removing portions of the second metallic material and the at least one first insulator material includes removing a top portion of the at least one first dielectric layer.

19. The method of claim 15, wherein removing a portion of the first metallic material comprises defining a metallic resistor over the substrate.

20. The method of claim 15, further comprising:
   forming at least one second dielectric layer over the first metallic capacitor plate;
   forming at least one second insulator material over the at least one second dielectric layer;
   forming a third metallic material over the at least one second insulator material; and
   removing portions of the third metallic material and the at least one second insulator material so as to form a third metallic capacitor plate and at least one second insulator layer of a second MIM capacitor, wherein the removal process uses the at least one second dielectric layer as an etch stop layer.

* * * * *